United States Patent
Hechtfischer et al.

(10) Patent No.: US 10,260,695 B2
(45) Date of Patent: Apr. 16, 2019

(54) LIGHT CONVERSION MODULE WITH IMPROVED CONTRAST

(71) Applicant: Lumileds Holding B.V., Schiphol (NL)

(72) Inventors: Ulrich Hechtfischer, Aachen (DE); Steffen Zozgornik, Aachen (DE)

(73) Assignee: LUMILEDS HOLDING B.V., Schiphol (NL)

( * ) Notice: Subject to any disclaimer, the term of this patent is extended or adjusted under 35 U.S.C. 154(b) by 0 days.

(21) Appl. No.: 16/064,967

(22) PCT Filed: Dec. 12, 2016

(86) PCT No.: PCT/EP2016/080560
§ 371 (c)(1),
(2) Date: Jun. 21, 2018

(87) PCT Pub. No.: WO2017/108463
PCT Pub. Date: Jun. 29, 2017

(65) Prior Publication Data
US 2018/0372293 A1    Dec. 27, 2018

(30) Foreign Application Priority Data

Dec. 23, 2015 (EP) ................. 15202568

(51) Int. Cl.
*F21S 41/176* (2018.01)
*F21S 41/16* (2018.01)
(Continued)

(52) U.S. Cl.
CPC ............. *F21S 41/176* (2018.01); *F21S 41/14* (2018.01); *F21S 41/16* (2018.01); *F21S 41/40* (2018.01); *F21S 45/47* (2018.01); *H01L 33/505* (2013.01)

(58) Field of Classification Search
CPC .......... F21S 41/176; F21S 41/16; F21S 45/47; F21S 41/40
See application file for complete search history.

(56) References Cited

U.S. PATENT DOCUMENTS

2011/0272720 A1    11/2011    Gardner et al.
2015/0062967 A1*    3/2015    Bae .................. G02B 6/0096
                                                                   362/610
(Continued)

FOREIGN PATENT DOCUMENTS

DE      10-2013-200521      *    7/2014
DE      102013200521 A1          7/2014
WO      2015000006 A1            1/2015

*Primary Examiner* — Tracie Y Green
(74) *Attorney, Agent, or Firm* — Volpe and Koenig, P.C.

(57) ABSTRACT

The invention describes a light conversion module (100) comprising a transparent substrate (120), a conversion layer (110) attached to a light exit side of the substrate (120), wherein the conversion layer (110) is arranged to convert a part of laser light (10) of a first wavelength range entering the substrate (120) via a light entrance side to converted laser light (20) of a second wavelength range different from the first wavelength range, and to transmit another part of the laser light (10), such that a mixture of the transmitted laser light (15) and of a part of the converted laser light (20) leaves the conversion layer (110) in forward direction opposite to the side where the conversion layer (110) is attached to the light exit side of the substrate (120), and wherein the substrate (120) is arranged such that converted laser light (20) entering the substrate via the light exit side is inhibited to re-enter the conversion layer (110) via the light exit side by arranging a thickness of the substrate (120) perpendicular to the light exit side such that the converted laser light (20) entering the substrate which is totally reflected at the light entrance side of the substrate (120) does not hit the conversion layer (110) after one total reflection at the light entrance (Continued)

side. The invention further describes a laser-based light source (200), especially an automotive headlight, comprising such a light conversion module (100). The invention further relates to a method of manufacturing such a light conversion module (100).

15 Claims, 5 Drawing Sheets

(51) Int. Cl.
*F21S 41/40* (2018.01)
*F21S 45/47* (2018.01)
*F21S 41/14* (2018.01)
*H01L 33/50* (2010.01)

(56) References Cited

U.S. PATENT DOCUMENTS

2016/0153632 A1   6/2016  Mitterlehner et al.
2017/0108190 A1*  4/2017  Hadrath ............... F21S 41/24

\* cited by examiner

LIGHT CONVERSION MODULE WITH IMPROVED CONTRAST

FIELD OF THE INVENTION

The invention relates to a light conversion module, a laser-based light source comprising such a light conversion module and a method of manufacturing the light conversion module.

BACKGROUND OF THE INVENTION

In modern automotive headlighting, a strong trend goes to adaptive systems where the light distribution can be changed dynamically. For example, one would like to have a high-beam pattern, but with a well-defined and moving dark section to spare out an oncoming car, to avoid glare. Or one would like to illuminate a given road sign, or an obstacle that, for example, a camera of a car could have detected.

Technically, such systems can be realized with different approaches, with increasing performance, but also complexity: switchable mechanical apertures, LED matrix lights, micro displays (as in beamers), or laser scanners. The principle of the laser scanner comprises a strong blue laser beam which can be electronically switched and direction-controlled by a small mirror, typically a MEMS (micro electromechanical system). In this way, it is quickly steered over a converter or phosphor surface of a light conversion module where it is partially converted to yellow light, which adds up with the remaining blue light to form white light. If the movement of the white-light spot on the phosphor is fast enough, it is perceived as a steady white-light distribution or image. This image is then projected onto the road through a lens. By a suitable control of the mirror movement, synchronized with a suitable switching of the laser beam (on and off, different intensities), a large variety of images on the phosphor—and thus light distributions on the road—can be created.

SUMMARY OF THE INVENTION

It is an object of the present invention providing a light conversion module with improved contrast.

According to a first aspect is a light conversion module provided. The light conversion module comprises a transparent substrate, a conversion layer attached to a light exit side of the transparent substrate. The conversion layer is arranged to convert laser light of a first wavelength range entering the substrate via a light entrance side to converted laser light of a second wavelength range different from the first wavelength range. The substrate is arranged such that converted laser light entering the substrate via the light exit side is inhibited to re-enter the conversion layer via the light exit side by arranging a thickness of the substrate perpendicular to the light exit side such that the converted laser light entering the substrate which is totally reflected at the light entrance side of the substrate does not hit the conversion layer after one total reflection at the light entrance side.

The substrate has to be transparent at least in the first wavelength range. The first wavelength range comprises preferably blue light. Transparency of the substrate means that transmission of light in the first wavelength range is higher than 80%, more preferably higher than 90% and most preferably higher than 95%. The intensity of the blue laser light should be at least 80% of an initial intensity $I_0$ when hitting the conversion layer the first time, wherein the intensity $I_0$ is the intensity received from, for example, a laser emitting blue laser light when entering the substrate. Transparency further means that there is preferably no scattering of the laser light in the first wavelength range. Scattering of the, for example, blue laser light may decrease contrast of light emitted by means of the conversion module. The blue laser light may enter the conversion layer in a nearly uncontrollable way.

The light conversion module may comprise a reflective layer which is arranged between the substrate and the conversion layer. The reflective layer is arranged such that the light within the second wavelength range is reflected and light within the first wavelength range is transmitted. The second wavelength range may, for example, comprise yellow light such that a mixture of the light of the first wavelength range and the second wavelength range results in essentially white light. The reflective layer may comprise a multilayer interference layer arrangement on the substrate between the phosphor or converter and the substrate. If this layer arrangement is designed to transmit the, for example, blue laser and reflect the yellow light back into the phosphor, the substrate-induced light leakage will be greatly reduced. However, the interference layer arrangement would have to reflect yellow at all angles, which is not possible with interference filters. There will always be angular or spectral ranges where the yellow light will be partially transmitted and still enter the substrate to eventually worsen the contrast.

The thickness of the substrate is preferably at least 10 mm, more preferably at least 14 mm and most preferably at least 16 mm such that converted laser light and the second wavelength range does essentially not hit and therefore re-enter the conversion layer after total reflection. The thickness of the substrate is not necessarily a homogeneous thickness across an area of the substrate covered by the conversion layer. One side of the substrate (e.g. light entrance and/or light exit side) may, for example, comprise a curvature such that the thickness of the substrate varies perpendicular to the conversion layer.

The thickness of the substrate is arranged such that light in the second wavelength range entering the substrate which is totally reflected at the backside does not hit the conversion layer after passing the thickness of the substrate two times. The thickness of the substrate further reduces the likelihood that light in the second wavelength range which is partially reflected at the backside or light entrance side of the substrate reenters the conversion layer.

The conversion layer may comprise, for example, phosphor or converter materials as Cerium doped YAG ($Y_3Al_5O_{12}$).

The substrate may comprise a material which is arranged to absorb light in the second wavelength range. The substrate may for example be arranged such that yellow light is at least partially absorbed within the substrate or parts thereof. The substrate may comprise, for example, colored glass which absorbs at least a part of the yellow light but transmits at least 80% of the blue light (first wavelength range). The reduction of the intensity of light within the second wavelength range entering the substrate at the light exit side after total reflection may be at least 50%, more preferably at least 70% and most preferably at least 90% if the light within the second wavelength range passes the substrate two times. The intensity reduction may be controlled by means of the respective absorption coefficient and the thickness of the substrate or parts of the substrate. A substrate comprising material which absorbs light within the second wavelength range may be combined with each embodiment described below.

The substrate may comprise an antireflective coating. The antireflective coating is arranged to reduce a reflectivity at a surface of the substrate different from the light exit side such that back reflection of converted laser light entering the substrate via the light exit side to the conversion layer is inhibited.

Light within the second wavelength range may be partially reflected at other sides of the substrate. Light in the second wavelength range which enters the substrate via the light exit side may especially be partially reflected (reflection angles smaller than the angle of total reflection) at the light entrance side of the substrate. This partial reflection can be avoided or at least reduced by means of a broadband antireflective coating. Light within the second wavelength range (e.g. yellow light) can essentially completely leave the substrate at the light entrance side. Back reflection of this light to the conversion layer is therefore avoided or at least reduced. The antireflective coating is preferably arranged such that light within the second wavelength range can leave the substrate if this light hits the side of the substrate covered by the antireflective coating at an angle between 0° and the angle of total reflection of the substrate material at the side of the substrate covered by the antireflective coating. The broadband antireflective coating is preferably further arranged to minimize reflection of light in the first wavelength range at the light entrance side of the substrate (immediate after partial or total reflection at the light entrance side or backside of the substrate). The broadband antireflective coating may in this case further avoid or at least reduce reflection of light in the first wavelength range back to the converter. The light may, for example, be (partially) reflected at light exit side of the substrate. Contrast of light emitted by means of the light conversion module may thus be improved by avoiding unwanted illumination of the converter by means of light in the first wavelength range (e.g. blue laser light).

The substrate may comprise a heat conducting material with a thermal conductivity of at least 10 W/(mK), more preferably at least 20 W/(mK) and most preferably at least 30 W/(mK).

The heat conducting material may, for example, be sapphire with a thermal conductivity of around 40 W/(mK). A substrate which comprises the heat conducting material may be combined with each embodiment described above or below.

The substrate may comprise a layer of the heat conducting material. A first side of the layer is arranged as the light exit side. A second side of the layer is parallel to the first side of the layer. A thickness t1 of the layer perpendicular to the first side is at least $t1=d/(2*\tan(\alpha 1))$, wherein d is a biggest (lateral) extension of the conversion layer parallel to the light exit side which can receive laser light. The angle $\alpha 1$ is an angle of total reflection in the second wavelength range with respect to a refractive index of the heat conducting material and a refractive index of the material adjoining the second side of the layer.

The light conversion module may comprise an aperture which may be arranged between the substrate and the conversion layer. The aperture may be arranged such that laser light within the first wavelength range can only illuminate a defined area of the conversion layer. The aperture may, for example, be used in order to avoid that laser light leaves the substrate without passing the conversion layer. Eye safety problems which may be caused by a malfunction of a scanner as, for example, a MEMS-mirror, may be reduced by means of the aperture. The second side of the layer may be arranged as the light entrance side of the substrate. The substrate may in this case comprise a homogeneous layer of heat conducting material as, for example, sapphire. Alternative materials may comprise MgO, especially single crystals, with a transmission of more than 80% for blue light and a thermal conductivity of more than 45 W/(mK) or $MgAl_2O_4$ with a thermal conductivity of around 15 W/(mK).

The layer of the heat conducting material may according to an alternative embodiment be a first substrate layer. The substrate comprises in this embodiment a second substrate layer attached to the second side of the first substrate layer. The second substrate layer comprises the light entrance side which is arranged opposite to the side of the second substrate layer attached to the first substrate layer. A thickness of the second substrate layer perpendicular to the light exit side is configured such that the converted laser light entering the substrate which is totally reflected at the light entrance side of the substrate does not hit the conversion layer immediately after reflection at the light entrance side.

The thickness of the first substrate layer is chosen such that the temperature difference between the center of the conversion layer and the sides of the substrate should be less than 35° C., more preferably less than 25° C. and most preferably less than 20° C. The thickness of the first substrate layer therefore depends on the thermal conductivity of the heat conducting material. The second substrate layer can be a material which is transparent in the first wavelength range but absorptive in the second wavelength range.

Conversion efficiency of the material of the conversion layer may decrease at higher temperatures. Temperature variations across the conversion layer should therefore be in a defined temperature range in order to avoid or at least limit variations of the color temperature of the mixture of light in the first wavelength range and the second wavelength range leaving the conversion layer. The temperature is increased due to conversion losses caused by the conversion of the light in the first wavelength range to the light in the second wavelength range.

The first substrate layer may, for example, comprise sapphire. The thickness of the first substrate layer is at least 0.5 mm, more preferably at least 1 mm and most preferably at least 2 mm in order to limit the temperature variation across the conversion layer.

The first substrate layer and the second substrate layer are attached to each other such that the second side of the first substrate layer touches the second substrate layer. A difference between a refractive index of the heat conducting material and a refractive index of a material comprised by the second substrate layer is less than 0.1, more preferably less than 0.05 and most preferably less than 0.02.

The refractive index of the material of the second substrate layer is preferably essentially the same as the refractive index of the material of the first substrate layer. The first substrate layer and the second substrate layer may be joined together by means of thermal bonding. The surfaces which should be joined together are polished and may be bonded at higher temperatures of 700° C. or more. The temperature used during thermal bonding may depend on the materials of the first and the second substrate layer.

The first substrate layer and the second substrate layer are attached to each other by means of an intermediate mechanical coupling layer according to an alternative embodiment. A refractive index of the mechanical coupling layer is in the range between a refractive index of the heat conducting material and a refractive index of a material comprised by the second substrate layer.

The refractive index of the intermediate mechanical coupling layer may be preferably smaller than the refractive index of the heat conductive material and bigger than the refractive index of the material of the second substrate layer. Optical adhesives or glues may be used as intermediate mechanical coupling layer. There are optical adhesives commercially available with a refractive index of up to 1.65. Even higher values of more than 1.7 are described in the literature. It is therefore possible to bond for example sapphire with a refractive index of 1.78 to a glass material (second substrate layer) with a refractive index of, for example, 1.55. The angle of total reflection would be rather high in this case due to the small difference between the refractive indices. In addition the amount of light in the second wavelength range partially reflected at a boundary layer or boundary layers is low. Furthermore, there is the option to add antireflective coatings to the substrate layers in order to suppress partial reflection at the boundaries.

The substrate may comprise at least one side surface adjoining the light exit side. The substrate comprises a reflection reduction structure arranged at least on a part of the at least one side surface. The substrate may, for example, comprise a cylindrical shape or a shape of a rectangular solid. A cylindrical side surface adjoins the light exit side in case of a cylindrical substrate shape. Four side surfaces adjoin the light exit side in case of a rectangular solid.

The reflection reduction structure may, for example, comprise a roughening of the side surface or surfaces in comparison to a surface roughness of the light entrance side and/or light exit side. The roughness of the side surface or surfaces is arranged such that the probability of partial or total reflection at the side surface or surfaces is reduced. The side surface or surfaces may, for example, be sandblasted.

The reflection reduction structure may alternatively or in addition comprise an absorption layer configured to absorb light in the second wavelength range. Furthermore, unwanted light in the first wavelength range (e.g. reflected blue laser light) is preferably absorbed, too.

Transparent silicon based material comprising, for example, carbon particles may be attached to the side surface or surfaces. The refractive index of the silicon based material is preferably chosen to be essentially the same as the substrate material in order to avoid or at least reduce reflection at a boundary layer between the substrate and the silicon material.

The substrate may have a circular cross-section perpendicular to a center line of the substrate, wherein the center line is arranged perpendicular to a center of the light exit side of the substrate. The substrate may, for example, have a cylindrical shape with a cylindrical side surface as described above.

The light conversion module may according to one embodiment comprise a substrate, wherein the light entrance surface comprises a concave curvature.

The curvature is arranged such that optical distortion by the substrate with respect to light within the first wavelength range entering the substrate via the light entrance side is minimized. The concave curvature of the light entrance side may, for example, be arranged such that there is a focal point in which a light source for emitting light within the first wavelength range can be placed.

The substrate may further comprise a curvature at a light exit side. The thin conversion layer (with a thickness of, for example, 50 µm) may be attached to the curved light exit side of the substrate. The curvature may be used in order to generate optical effects especially in combination with optical elements as lenses or reflectors which can be combined with the light conversion module in a light source comprising the light conversion module.

According to a further aspect a laser-based light source is provided. The laser-based light source comprises the light conversion module as described above, a laser module and an optical device. The light conversion module is arranged between the laser module and the optical device. The laser-based light source is arranged such that laser light in the first wavelength range emitted by the laser module enters the substrate via the light entrance side and leaves the substrate via the light exit side, and wherein the laser-based light source is further arranged such that at least a part of the converted laser light and transmitted laser light which passes the conversion layer is imaged by means of the optical device to a target.

The laser light in the first wavelength range is transmitted via the substrate and partially converted in the conversion layer. The conversion layer may be arranged such that the yellow light is coupled out into the forward direction, and such that laser light is scattered in order to provide a broader angular light distribution of light in the first wavelength range which is mixed with light in the second wavelength range.

According to a further aspect an automotive headlight is provided. The automotive headlight comprises the laser-based light source described above.

According to a further aspect a method of manufacturing a light conversion module is provided. The method comprising the steps of:
  providing a transparent substrate,
  attaching a conversion layer to a light exit side of the transparent substrate, wherein the conversion layer is arranged to convert laser light of a first wavelength range entering the substrate via a light entrance side to converted laser light of a second wavelength range different from the first wavelength range,
  arranging the substrate such that converted laser light entering the substrate via the light exit side is inhibited to re-enter the conversion layer via the light exit side by arranging a thickness of the substrate perpendicular to the light exit side such that the converted laser light entering the substrate which is totally reflected at the light entrance side of the substrate does not hit the conversion layer after one total reflection at the light entrance side.

The steps of the method are not necessarily performed in the order as presented above. The thickness of the substrate may, for example be arranged after attaching the conversion layer by grinding or alternatively by gluing an additional substrate layer.

It shall be understood that the light conversion module according to any one of claims 1 to 12 and the method of claim 15 have similar and/or identical embodiments, in particular as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

Figure 1:
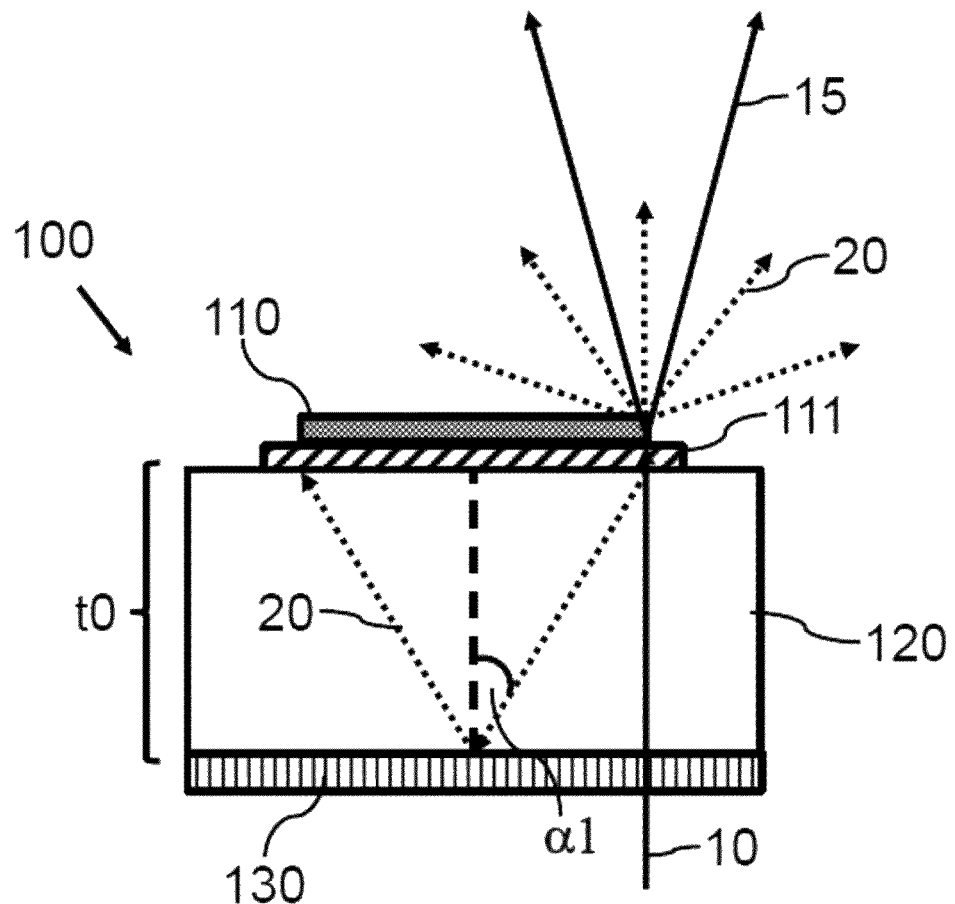
Figure 2:
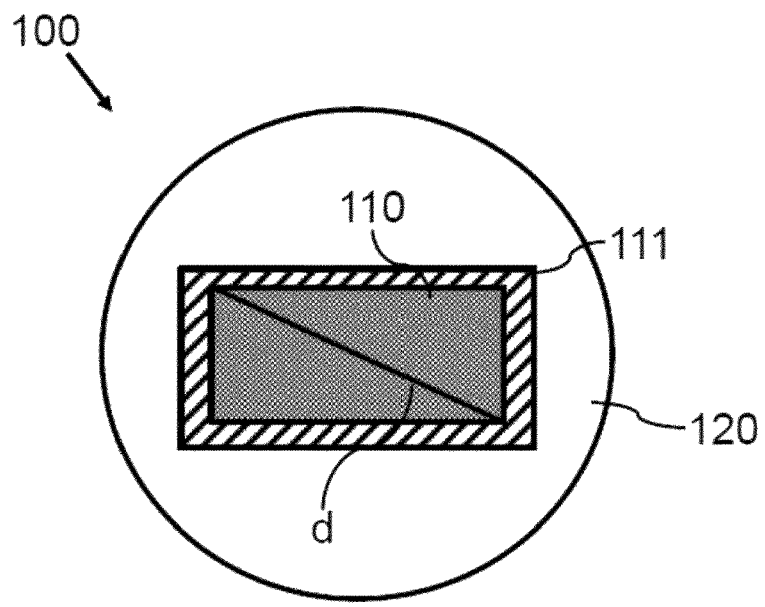
Figure 3:
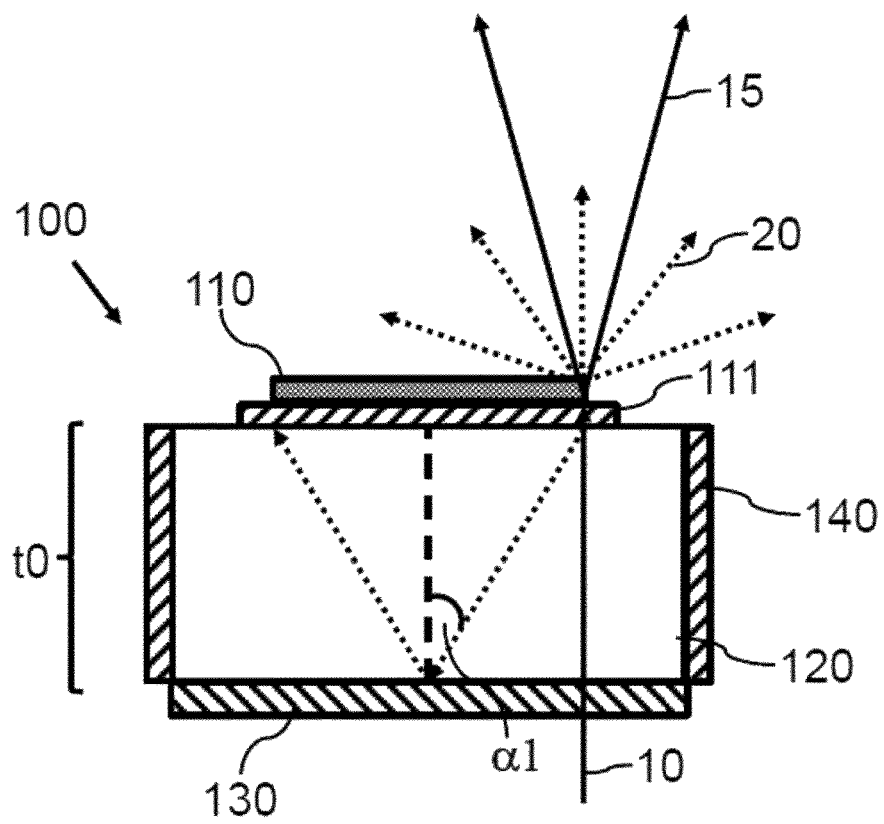
Figure 4:
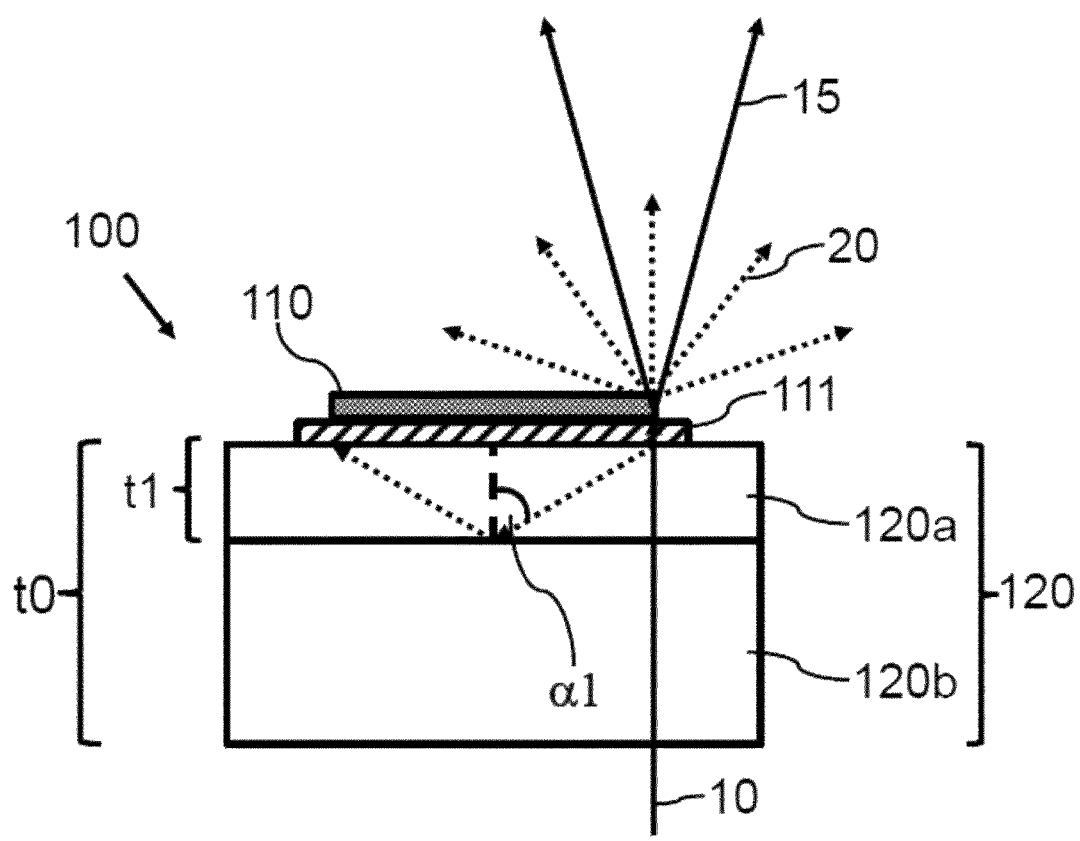
Figure 5:
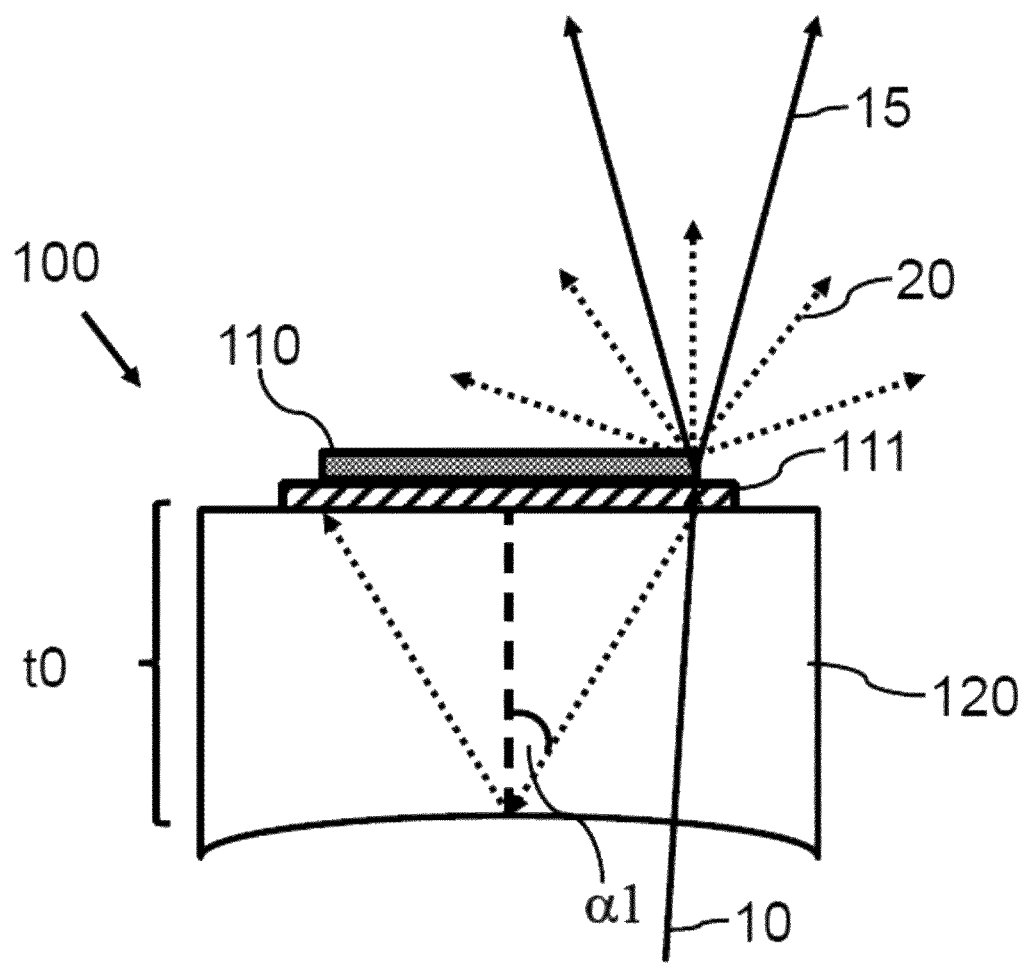
Figure 6:
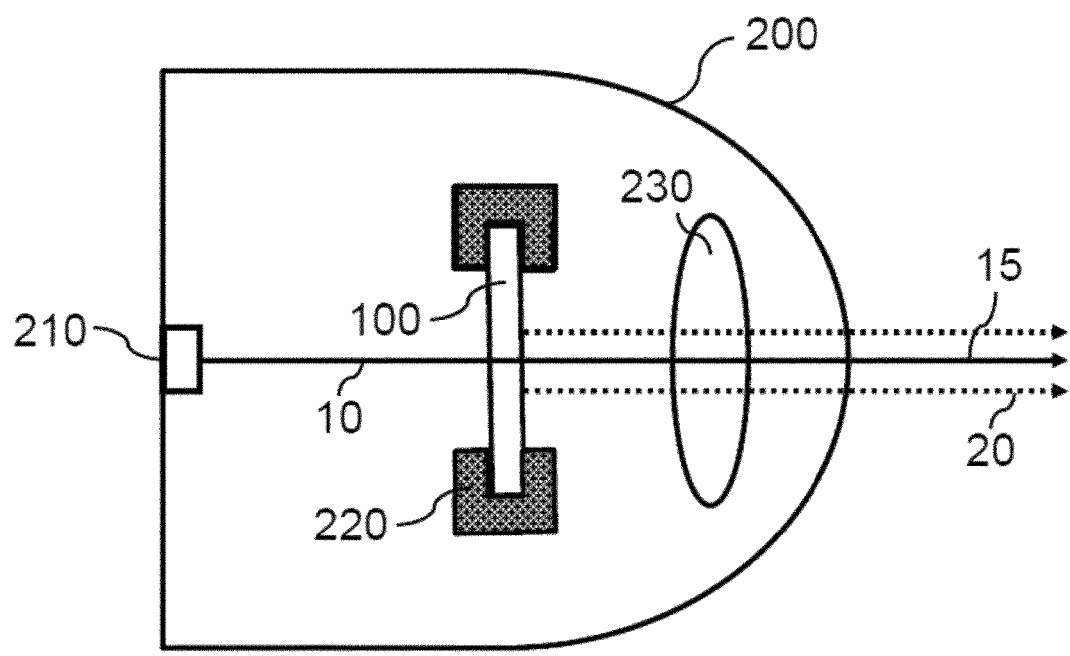
Figure 7:
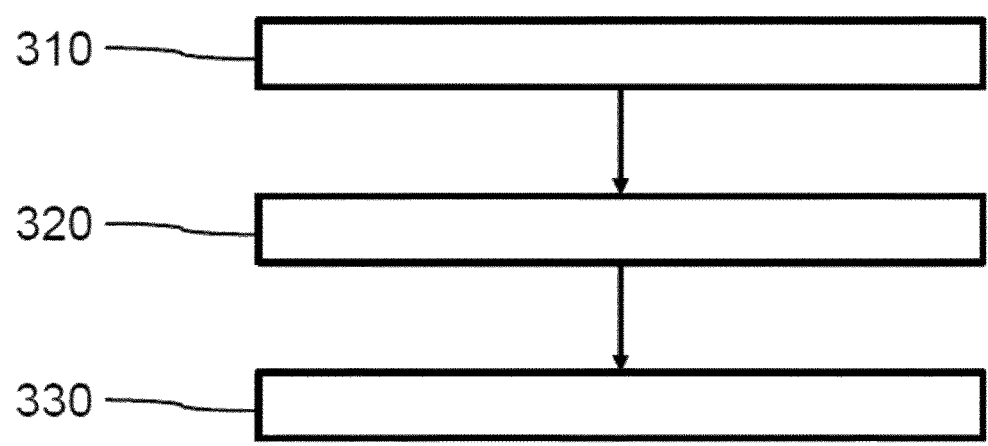

FIG. 1 shows a principal sketch of a cross-section of a first light conversion module FIG. 2 shows a principal sketch of a front view of a second light conversion module FIG. 3 shows a principal sketch of a cross-section of a third light conversion module FIG. 4 shows a principal sketch of a cross-section of a fourth light conversion module FIG. 5 shows a principal sketch of a cross-section of a fifth light conversion module FIG. 6 shows a principal sketch of a laser-based light source comprising a light conversion module FIG. 7 shows a principal sketch of a method of manufacturing a light conversion module In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

FIG. 1 shows a principal sketch of a cross-section of a first light conversion module 100. The first light conversion module 100 comprises a conversion layer 110 for converting especially laser light 10 within a first wavelength range (e.g. blue laser light) to converted laser light 20 within a second wavelength range different from the first wavelength range (e.g. yellow light). A part of the laser light 10 which is not converted into conversion layer 110 is scattered in the conversion layer 110 such that transmitted laser light 15 is characterized by a broader light distribution as the laser light 10 hitting the conversion layer 110. The first light conversion module 100 further comprises a substrate 120 with a thickness t0 and a reflective layer 111 arranged between the substrate 120 and the conversion layer 110. The reflective layer 111 is reflective in the second wavelength range such that converted laser light 20 hitting the reflective layer 111 within a predefined range of angles cannot enter the substrate 120. The first light conversion module 100 further comprises an antireflection coating 130 which is arranged at a light entrance side of the substrate (the side at which the laser light 10 enters the substrate 120) such that converted laser light 20 entering the substrate 120 via the reflective layer 111 and a light exit side of the substrate can leave the substrate 120 via the parallel light entrance side of the substrate 120. Especially partial reflection of the converted laser light 20 at the light entrance side may be avoided or at least reduced by means of the antireflection coating 130. Furthermore, reflection of laser light 10 at the light entrance side of the substrate 120 may be avoided by means of the broadband antireflection coating 130.

The thickness t0 of the layer perpendicular to the first side is at least $t0=d/(2*\tan(\alpha 1))$, wherein d is a biggest or maximum extension of the conversion layer 110 parallel to the light exit side which can receive laser light 10. The angle $\alpha 1$ is an angle of total reflection in the second wavelength range with respect to a refractive index of the substrate material and a refractive index of the material adjoining the light entrance side of the substrate 120. The thickness t0 is chosen such that converted laser light 20 which is totally reflected at the light entrance side of the substrate 120 does not hit the area of the light exit side which is covered by the conversion layer 110. The conversion layer 110 comprises a thin phosphor layer (e.g. 25 μm thickness) which has been glued, e.g. by transparent silicone glue on the front surface or to be more precise on the light exit side of the substrate 120. The material of the thick substrate 120 is preferably sapphire. The critical angle $\alpha 1$ for total reflection against air is 33.7°. A phosphor or conversion layer 110 with lateral dimensions 10×20 mm$^2$, has a diagonal of 22.4 mm. The above formula then gives t0=16.73 mm as a minimum substrate thickness. Including a safety margin a thickness of t0=20 mm may be chosen. The substrate 120 has in this embodiment a shape of a rectangular solid. The cross section is taken along the diagonal of 22.4 mm.

The conversion layer 110 may comprise any shape (not necessarily rectangular as discussed above) which may enable illumination of a defined target or target area.

FIG. 2 shows a principal sketch of a front view of a second light conversion module 100. The substrate 120 has in this case a cylindrical shape with a thickness t0=17 mm. A reflective layer 111 is provided on top of the cylinder between the substrate 120 and the conversion layer 110 with a maximum extension d of the conversion layer 110 parallel to the light exit side of the substrate 120 which can receive laser light 10. The lateral size of the cylindrical substrate 120 is characterized by a diameter of 25 mm. The cylindrical shape of the substrate in the present example was chosen just for ease of mounting in standard optomechanical holders. The excess volume is actually not needed. The lateral dimensions do not have to be larger than the phosphor layer.

FIG. 3 shows a principal sketch of a cross-section of a third light conversion module 100. The configuration of the third light conversion module 100 is nearly identical with the configuration discussed with respect to FIG. 1. The substrate 120 consists of sapphire which is absorptive in the second wavelength range. Chromium may be added in this case to the sapphire material in order to provide blue sapphire material which transmits blue laser light 10 but absorbs yellow converted laser light. The substrate 120 is a rectangular block with a thickness t0 perpendicular to the light exit side of the substrate 120 of 22 mm and a size of the light entrance and light exit side is 12×22 mm$^2$. The four side surfaces of the substrate 120 are covered by the reflection reduction structure 140 which comprises a transparent resin with a refractive index of 1.5. Carbon flakes are added to the resin in order to absorb yellow light or more precisely light within the second wavelength range which enters the reflection reduction structure 140. Blue light or light in the first wavelength range shall be absorbed in order to avoid or at least reduce the likelihood that light in the first wavelength range enters the conversion layer 110 in an uncontrolled way.

FIG. 4 shows a principal sketch of a cross-section of a fourth light conversion module 100. The fourth light conversion module comprises a substrate 120 with a first substrate layer 120a of heat conducting material with thermal conductivity of more than 20 W/(mK) and a thickness t1 and a second substrate layer 120b thermally bonded to the first substrate layer 120a. The total thickness of the substrate 120 is t0. The thickness t1 is arranged such that converted laser light 20 totally reflected at the boundary surface between the first substrate layer 120a and the second substrate layer 120b does not hit the conversion layer 110. The differences of the refractive indices reduce the thickness of the first substrate layer 120a. Taking a refractive index of sapphire of 1.78 and a refractive index of the second substrate layer of 1.46 (reflective index of silica) the angle of total reflection is around 56.5°. Total reflection at the interface between the two layers which results in back reflection to the conversion layer 110 is avoided if the thickness of the Sapphire layer is at least 7.5 mm taking the extension of the conversion layer 110 of 10×20 mm² as described with respect to FIG. 1.

The minimum thickness t0 depends on the refractive index of the material of the first substrate layer 120a and the refractive index of the material of the second substrate layer 120b as described above. The total thickness t0 of the substrate 120 is again arranged such that converted laser light 20 which is totally reflected at the light entrance side of the substrate 120 which is averted from the light exit side of the substrate 120 does not hit conversion layer 110. The conversion layer 110 is again attached to a reflective layer 111 which is arranged between conversion layer 110 and the substrate 120. The first substrate layer 120a may, for example, comprise sapphire with a refractive index of 1.78. The second substrate layer 120b may, for example, comprise silica with a refractive index of 1.46. The silica layer may be absorptive in order to absorb yellow converted laser light 20.

The second substrate layer 120b may in an alternative embodiment comprise glass (SF-11) with a refractive index nearly equal to the refractive index of sapphire. The thickness of the sapphire layer can in this case be reduced to the absolute minimum which is needed in order to provide sufficient cooling for the conversion layer 110 (e.g. a thickness of 1 mm). The total thickness of the substrate would in this case be the same as discussed above (t0 at least 16.73 mm) because the substrate is characterized by one refractive index.

A laser may for example emit laser light 10 with 20 W of blue laser light and 10.5 W of the 20 W of laser light 10 may be converted to heat. Taking an area of the conversion layer 110 with a size of 2 cm² and a thickness of the conversion layer 110 of 25 μm this would result in a temperature difference between the lateral center of the thin conversion layer 110 and the sides of the substrate 120 of 20° C. if the first substrate layer 120a comprises sapphire with a thickness of 1 mm and a thermal conductivity of 40 W/(mK). The second substrate layer 120b was in this example a silica layer with a thickness of 20 mm and a thermal conductivity of 1.38 W/(mK). It is assumed in this simulation that the laser spot moves that fast across the conversion layer 110 that the heat flow from the conversion layer to the sapphire layer is essentially constant. Thermal conductivity of the sapphire layer has been conservatively assumed as 30 W/(mK).

FIG. 5 shows a principal sketch of a cross-section of a fifth light conversion module 100. The fifth light conversion module 100 comprises a substrate 120, a reflective layer 111 and a conversion layer 110 as discussed with respect to FIG. 2. The substrate 120 has a cylindrical shape and the light entrance side is curved. The curvature of the light entrance side is chosen such that the light entrance side defines a focal point in which a light source emitting light of the first wavelength range (e.g. one or more lasers or a corresponding scanner) can be placed. Reflection of light of the first wavelength range at the light entrance side of the substrate 120 may therefore be reduced.

FIG. 6 shows a principal sketch of a laser-based light source 200 comprising a light conversion module 100 as described above, for example, with respect to FIG. 2. The laser-based light source 200 comprises a laser module 210 for emitting laser light 10 within the first wavelength range. The substrate 120 of the light conversion module 100 is surrounded by a heat sink 220 which is configured to spread heat generated by the conversion process. The laser-based light source 200 further comprises an optical device 230 which may comprise one or more optical elements like lenses, reflectors and the like. The optical device 230 is arranged to image transmitted laser light 15 and converted laser light 20 to a target region. The laser module 210 may comprise at least one laser for emitting a strong blue laser beam. The at least one laser can be electronically switched and a direction of the laser light 10 may be controlled by a small mirror, typically a MEMS (micro electromechanical system), in order to move the laser beam across the conversion layer 110.

The laser module 210 may alternatively comprise two, three or more switchable lasers or even a laser array.

The laser-based light source 200 shown in FIG. 6 is preferably an automotive headlight for illuminating streets and the surroundings. Control of the laser is used in order to provide an adaptive light pattern enabling high brightness with a minimum of glare of oncoming traffic or other traffic participants.

FIG. 7 shows a principal sketch of a method of manufacturing a light conversion module. A transparent substrate 120 as described above is provided in step 310. A conversion layer 110 is attached to a light exit side of the transparent substrate 120 in step 320. The conversion layer 110 is arranged to convert laser light 10 of a first wavelength range entering the substrate via a light entrance side to converted laser light 20 of a second wavelength range different from the first wavelength range. The substrate is arranged in step 330 such that converted laser light entering the substrate via the light exit side is inhibited to re-enter the conversion layer via the light exit side.

A reflective layer 111 may be arranged between the substrate 120 and the conversion layer 110 in an additional manufacturing step.

It is a basic idea of the present invention to provide a light conversion module 100 enabling a maximum of edge contrast when used within a laser-based light source 200. The laser-based light source 200 is preferably an automotive headlight. The thickness of the substrate 120 which is directly or indirectly attached to the conversion layer 110 is increased such that maximum edge contrast is reached when the conversion layer 110 is only partly illuminated by means of laser light 10 within a first wavelength range (e.g. blue laser light). Partial darkening of the conversion layer 110 or phosphor is necessary to create fully dark zones in, for example, the headlamp beam or bundle, to spare out oncoming traffic. Maximizing contrast means preventing essentially any leakage or spread of light from the laser-illuminated regions of the conversion layer 110 to the dark regions. Part of this light leakage may be due to the conversion layer 110 or phosphor itself. The converted laser light 20 within the second wavelength region (e.g. yellow light) is first emitted isotropically, and care must be taken to prevent the yellow light from spreading in the conversion layer 110. Scattering in the material may therefore be increased. The conversion layer 110 may alternatively or in addition be made as thin as possible.

However, when the conversion layer has been optimized in this way, it is the transparent substrate 120 which remains as a significant source of light leakage. The presence of the substrate 120 is mandatory. Without it, the thin conversion layer 110 or phosphor layer would not be mechanically stable, nor could it be kept cool by heat conduction to the substrate 120. The substrate caused light leakage is due to the following mechanism: The yellow light which is generated in a spot of the blue-laser scanning beam is emitted into all directions, including towards the substrate 120. Because of the optical contact between conversion layer 110 and substrate 120, it can hit the backside or light entrance side of the transparent substrate 120 under total reflection angles, and will be reflected back to the conversion layer 110 at a distance from the spot. The totally reflected converted laser light 20 can also exit the conversion layer 110 and in this way create unwanted light in a non-illuminated part of the conversion layer 110. The invention proposes to provide a substrate 120 with a thickness t0 which increases the distance between the spot and the back reflected converted laser light 20 such that the converted laser light 20 totally reflected at the backside of the substrate does not hit an area element of the conversion layer 110 which can be used for illumination. Non-illuminated parts of the conversion layer 110 keep therefore dark.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser light
15 transmitted laser light
20 converted laser light
100 light conversion module
110 conversion layer
111 reflective layer
120 substrate
120a first substrate layer
120b second substrate layer
130 antireflection coating
140 reflection reduction structure
200 laser based light source
210 laser module
220 heat sink
230 optical device
310 step of providing substrate
320 step of attaching conversion layer
330 step of arranging substrate
t0 substrate thickness
t1 thickness of first substrate layer
α1 angle of total reflection
d maximum lateral extension of the conversion layer

The invention claimed is:

1. A light conversion module comprising:
a transparent substrate,
a conversion layer attached to a light exit side of the substrate, wherein the conversion layer is arranged to convert a part of laser light of a first wavelength range entering the substrate via a light entrance side to converted laser light of a second wavelength range different from the first wavelength range, and
to transmit another part of the laser light, such that a mixture of the transmitted laser light and of a part of the converted laser light leaves the conversion layer in forward direction opposite to the side where the conversion layer is attached to the light exit side of the substrate, and
wherein the substrate is arranged so that converted laser light entering the substrate via the light exit side is inhibited to re-enter the conversion layer via the light exit side by arranging a thickness of the substrate perpendicular to the light exit side, thus the converted laser light entering the substrate which is totally reflected at the light entrance side of the substrate does not hit the conversion layer after one total reflection at the light entrance side.

2. The light conversion module according to claim 1, wherein the substrate comprises a material which is arranged to absorb light in the second wavelength range such that an intensity of light within the second wavelength range entering the substrate at the light exit side after total reflection at the light entrance side is at least 50% reduced if the light within the second wavelength range passes the substrate two times.

3. The light conversion module according to claim 1, wherein the substrate comprises an antireflective coating, wherein the antireflective coating is arranged to reduce a reflectivity at a surface of the substrate different from the light exit side such that back reflection of converted laser light entering the substrate via the light exit side to the conversion layer is inhibited.

4. The light conversion module according to claim 3, wherein the antireflective coating is arranged on the light entrance side of the substrate.

5. The light conversion module according to claim 1, wherein the substrate comprises a heat conducting material with a thermal conductivity of at least 10 W/(mK).

6. The light conversion module according to claim 5, wherein the substrate comprises a layer of the heat conducting material, wherein a first side of the layer is arranged as the light exit side, wherein a second side of the layer is parallel to the first side of the layer, wherein a thickness t1 of the layer perpendicular to the first side is at least t1=d/(2*tan(a1)), wherein d is a biggest extension of the conversion layer parallel to the light exit side which can receive laser light, and wherein a1 is an angle of total reflection in the second wavelength range with respect to a refractive index of the heat conducting material and a refractive index of the material adjoining the second side of the layer.

7. The light conversion module according to claim 6, wherein the layer of the heat conducting material is a first substrate layer, wherein the substrate comprises a second substrate layer attached to the second side of the first substrate layer, wherein the second substrate layer comprises the light entrance side which is arranged opposite to the side of the second substrate layer attached to the first substrate layer, wherein a thickness of the second substrate layer perpendicular to the light exit side is configured such that the converted laser light entering the substrate which is totally reflected at the light entrance side of the substrate does not hit the conversion layer immediately after reflection at the light entrance side.

8. The light conversion module according to claim 7, wherein the first substrate layer and the second substrate layer are attached to each other such that the second side of the first substrate layer touches the second substrate layer, and wherein a difference between a refractive index of the heat conducting material and a refractive index of a material comprised by the second substrate layer is less than 0.1.

9. The light conversion module according to claim 8, wherein the first substrate layer and the second substrate layer are attached to each other by means of an intermediate mechanical coupling layer, and wherein a refractive index of the mechanical coupling layer is in the range between a refractive index of the heat conducting material and a refractive index of a material comprised by the second substrate layer.

10. The light conversion module according to claim 1, wherein the substrate comprises at least one side surface adjoining the light exit side, and wherein the substrate comprises a reflection reduction structure arranged at least on a part of the at least one side surface.

11. The light conversion module according to claim 10, wherein the substrate comprises a circular cross-section perpendicular to a center line of the substrate, wherein the center line is arranged perpendicular to a center of the light exit side of the substrate.

12. The light conversion module according to claim 5, wherein the layer of the heat conducting material comprises sapphire.

13. A laser-based light source comprising the light conversion module according to claim 1, a laser module and an optical device, wherein the light conversion module is arranged between the laser module and the optical device, wherein the laser-based light source is arranged such that laser light in the first wavelength range emitted by the laser module enters the substrate via the light entrance side and leaves the substrate via the light exit side, and wherein the laser-based light source is further arranged such that at least a part of the converted laser light and transmitted laser light which passes the conversion layer is imaged by means of the optical device to a target region.

14. An automotive headlight comprising the laser-based light source according to claim 13.

15. A method of manufacturing a light conversion module, the method comprising the steps of:
providing a transparent substrate,
attaching a conversion layer to a light exit side of the substrate,
arranging the conversion layer
to convert a part of laser light of a first wavelength range entering the substrate via a light entrance side to converted laser light of a second wavelength range different from the first wavelength range, and
to transmit another part of the laser light, such that a mixture of
the transmitted laser light and of a part of the converted laser light leaves the conversion layer in forward direction opposite to the side where the conversion layer is attached to the light exit side of the substrate, and
arranging the substrate so converted loser light entering the substrate via the light exit side is inhibited to re-enter the conversion layer via the light exit side by arranging a thickness of the substrate perpendicular to the light exit side so the converted loser light entering the substrate which is totally reflected at the light entrance side of the substrate does not hit the conversion layer after one total reflection at the light entrance side.

\* \* \* \* \*